(12) United States Patent
Johnstone et al.

(10) Patent No.: US 7,277,820 B2
(45) Date of Patent: Oct. 2, 2007

(54) APPARATUS AND METHOD FOR GENERATING A COMPLEMENTARY CUMULATIVE DISTRIBUTION FUNCTION (CCDF) CURVE

(75) Inventors: Colin Johnstone, Inverkeithing (GB); Eric Breakenridge, Alloa (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/418,540

(22) Filed: May 4, 2006

(65) Prior Publication Data

US 2006/0259257 A1 Nov. 16, 2006

(30) Foreign Application Priority Data

May 13, 2005 (GB) ................... 0509857.9

(51) Int. Cl.
*G06F 19/00* (2006.01)
(52) U.S. Cl. ................... 702/180; 324/76.11
(58) Field of Classification Search ........ 702/180, 702/182–185, 188, 121, 125, 66; 324/76.11
See application file for complete search history.

(56) References Cited

U.S. PATENT DOCUMENTS 5,838,153 A 11/1998 Inbar

2005/0143982 A1* 6/2005 He et al. ................. 704/216

FOREIGN PATENT DOCUMENTS

| EP | 0071539 A2 | 2/1983 |
| EP | 0418499 A2 | 3/1991 |
| EP | 0518116 A1 | 12/1992 |
| GB | 1278000 A | 6/1972 |
| JP | 06309473 A | 11/1994 |

OTHER PUBLICATIONS

GB Search Report, GB0509857.9, Oct. 2005.

* cited by examiner

*Primary Examiner*—Edward Raymond
(74) *Attorney, Agent, or Firm*—Marc Bobys

(57) ABSTRACT

In apparatus for generating a Complementary Cumulative Distribution Function (CCDF) curve for an input signal, an analog to digital converter (ADC) samples the input signal at sampling points to provide a parameter value corresponding to a desired parameter of the input signal at each sampled point. A memory element provides a frequency count of occurrence of each received parameter value from an address in the memory corresponding to the received parameter value. An adder receives the frequency count, increments the count and provides the incremented count to an input of the memory element for writing back into the address corresponding to the received parameter value. A CCDF curve generating module reads the frequency count stored in the memory element corresponding to each parameter value and generates a CCDF curve therefrom.

18 Claims, 5 Drawing Sheets

APPARATUS AND METHOD FOR GENERATING A COMPLEMENTARY CUMULATIVE DISTRIBUTION FUNCTION (CCDF) CURVE

PRIORITY CLAIM

Foreign priority rights under Title 35, United States Code Section 119, to Great Britain Application Number 0509857.9, filed May 13, 2005, are hereby claimed.

This invention relates to an apparatus and method for generating a Complementary Cumulative Distribution Function (CCDF) curve, especially, though not exclusively, to such a CCDF curve for signal power, for example in Radio Frequency applications.

BACKGROUND ART

A power CCDF curve is frequently used in RF applications to provide critical information about the signals encountered in RF systems, for example in modern $3^{rd}$ Generation (3G) digitally modulated radio systems. The power CCDF curve consists of a curve relating the percentage of time a radio signal spends at or above a particular power level. It is usually shown as a graph of the ratio of the instantaneous power to the average power against percentage of time that the signal power is at, or above, the power specified in the X axis. Both axes of the graph are usually logarithmic.

Perhaps the most important application of power CCDF curves is to specify completely the power characteristics of the signals that will be mixed, amplified and decoded in communication systems. For example, 3G systems combine multiple channels resulting in a peak-to-average power ratio that is dependent upon not only the number of channels, but also which specific channels are used. This signal characteristic can lead to higher distortion unless the peak power levels are accounted for in the design of system components, such as amplifiers and mixers.

As well as examining a graph, a user may also request the power level at which a certain percentage of the measurements lie in excess. Typical percentages lie in the range of 0.01% to 0.0001%. For example, if a sample of 100,000 measurements has taken place and if the user requires the power ratio at which 0.01% of samples lie in excess then there will be 10 samples lying above the 0.01% percentage point (0.01%=$^1/_{10,000}$). Normally the ratio of the tenth largest sample to the calculated average power is returned.

Such a CCDF curve appears in several kinds of measurement instrument from power meters to spectrum analysers and a few others as well. All these instruments have needed to generate a histogram of the power values received and then convert it to the CCDF graph. This task is carried out by sampling the incoming signal using an Analogue-to-Digital converter (ADC), storing the resulting captured samples in memory and then calculating a histogram of the received values by scanning the captured samples, converting each received value from voltage to power if necessary, and then summing each value or small set of values into many accumulators before using the resultant table of occurrences to draw a graph and/or work out the percentages.

A typical system can take around 5 seconds to measure and process 100,000 samples. In most known systems, samples tend to be captured at high speed for a short time, then the captured samples are processed and then another batch of samples are taken. Current ADC technologies are capable of running at speeds in the range of 10M samples/second up to, in some cases, several Giga samples per second. What this means is that a typical system will take very short snapshots of a waveform, which can result in missing the elusive high peak levels that have the greatest effect on the resulting measurement numbers.

It can also be readily seen that 100,000 samples provides only ten samples "above the line" for a 0.01% measurement. Measurements of 0.001% or 0.0001% would require orders of magnitude more time to get the same accuracy. Furthermore, ten samples is, in some circumstances, not a sufficiently large number on which to base an accurate measurement.

DISCLOSURE OF INVENTION

The present invention therefore seeks to provide a method and apparatus for generating a Complementary Cumulative Distribution Function (CCDF) curve for an input signal, which overcomes, or at least mitigates, the above-mentioned problems of the prior art.

Accordingly, in one aspect, the invention provides an apparatus for generating a Complementary Cumulative Distribution Function (CCDF) curve for an input signal, the apparatus comprising an Analog to Digital Converter (ADC) having an input for receiving the input signal and an output, the ADC sampling the input signal at sampling points to provide a parameter value corresponding to a desired parameter of the input signal at each sampled point at the output, a plurality of memory elements for storing frequency counts of occurrences of each received parameter value in respective, differing ranges of parameter values, each memory element having an input coupled to the output of the ADC for receiving parameter values and an output for providing a frequency count from an address in the memory corresponding to the received parameter value, a plurality of adders, each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value, and a CCDF curve generating module having an input coupled to an output of the memory elements for reading the frequency counts stored in the memory elements corresponding to each parameter value and for generating a CCDF curve therefrom.

In one embodiment, each memory element may comprise two banks of memory of which a first bank is utilised for a predetermined period of time for storing the frequency counts of occurrences of each received parameter value and a second bank is utilised for the predetermined period for reading by the CCDF curve generating module the frequency counts of occurrences of each received parameter value stored therein in a previous predetermined period, the banks being switched at the end of the predetermined period of time so that the bank that was being read in the previous predetermined period is used for storing and vice versa.

Each memory element may be a dual port memory, of which a first port is utilised as the output of the memory element coupled to the input of the respective adder on one clock cycle of the memory element and as the input of the memory element coupled to the output of the respective adder on the next clock cycle, and a second port of which is utilised as the output of the memory element coupled to the input of the CCDF curve generating module.

In a second embodiment, each memory element may comprise a single bank, which is utilised for a first predetermined period of time for storing the frequency counts of occurrences of each received parameter value and is utilised for a second predetermined period of time for reading by the CCDF curve generating module the frequency counts of occurrences of each received parameter value stored therein in a previous first predetermined period.

The CCDF curve generating module may comprise a memory for storing the frequency counts of occurrences of each received parameter value read by the CCDF curve generating module during the second predetermined period of time.

Each memory element may be a dual port memory, of which a first port is utilised as the output of the memory element coupled to the input of the respective adder on a first clock cycle of the memory element and a second port of which is normally utilised as the input of the memory element coupled to the output of the respective adder on a second clock cycle.

The apparatus may further comprise a comparator having a first input for receiving a received parameter value on the first clock cycle and a second input for receiving a next received parameter value on the second clock cycle and an output for providing a match signal if the received parameter value and the next received parameter value are the same, the output of the comparator being coupled to the dual port memory and the match signal being utilised to enable the first port of the dual port memory to be utilised as the input for the second clock cycle so that the frequency count incremented on the first clock cycle is provided at the first port instead of the second port and is therefore correctly provided to the input of the adder on the second clock cycle.

In one embodiment, updating of the frequency counts in the dual port memory takes place at the same frequency as the clock frequency of the dual port memory. When a frequency count is read by the CCDF curve generating module from the memory elements, the frequency count may be set to zero.

The apparatus may further comprise a multiplexer having an input coupled to the output of the ADC for receiving the parameter value and a plurality of outputs, each output being coupled to one of the plurality of memory elements, the multiplexer passing the received parameter value to one of the outputs based on the range of parameter values within which the received parameter value falls.

The memory elements may accept shorter bit length data words than the bit length of data words received from the ADC, and the multiplexer may pass a reduced length of each parameter value data word received from the ADC to one of the plurality of outputs based on the most significant data bits that are present in the parameter value data word received from the ADC.

In a second aspect, the invention provides a method for generating a Complementary Cumulative Distribution Function (CCDF) curve for an input signal, the method comprising sampling the input signal at sampling points to provide a parameter value corresponding to a desired parameter of the input signal at each sampled point, receiving each parameter value and storing frequency counts of occurrences of each received parameter value as they arrive, the counts being stored in respective, differing ranges of parameter values, incrementing the respective stored frequency count for each received parameter value, and generating a CCDF curve from the stored frequency counts.

In a first embodiment, a first bank of a plurality of memory elements may be utilised for storing for a predetermined period of time the frequency counts of occurrences of each received parameter value in respective, differing ranges of parameter values, and a second bank of the memory elements may be utilised for the predetermined period for reading the frequency counts of occurrences of each received parameter value stored therein in a previous predetermined period, the banks being switched at the end of the predetermined period of time so that the bank that was being read in the previous predetermined period is used for storing and vice versa.

In a second embodiment, a single bank of a plurality of memory elements may be utilised for a first predetermined period of time for storing the frequency counts of occurrences of each received parameter value in respective, differing ranges of parameter values, and is utilised for a second predetermined period of time for reading the frequency counts of occurrences of each received parameter value stored therein in a previous first predetermined period.

The frequency count may be set to zero after the frequency count is read from each memory element.

The desired parameter may be power and the input signal may be a Radio Frequency (RF) signal, or the power envelope thereof.

BRIEF DESCRIPTION OF DRAWINGS

At least one embodiment of a method and apparatus in accordance with this invention, for generating a Complementary Cumulative Distribution Function (CCDF) curve, will now be described, by way of example, with reference to the accompanying drawings, in which.

DETAILED DESCRIPTION

Figure 1:
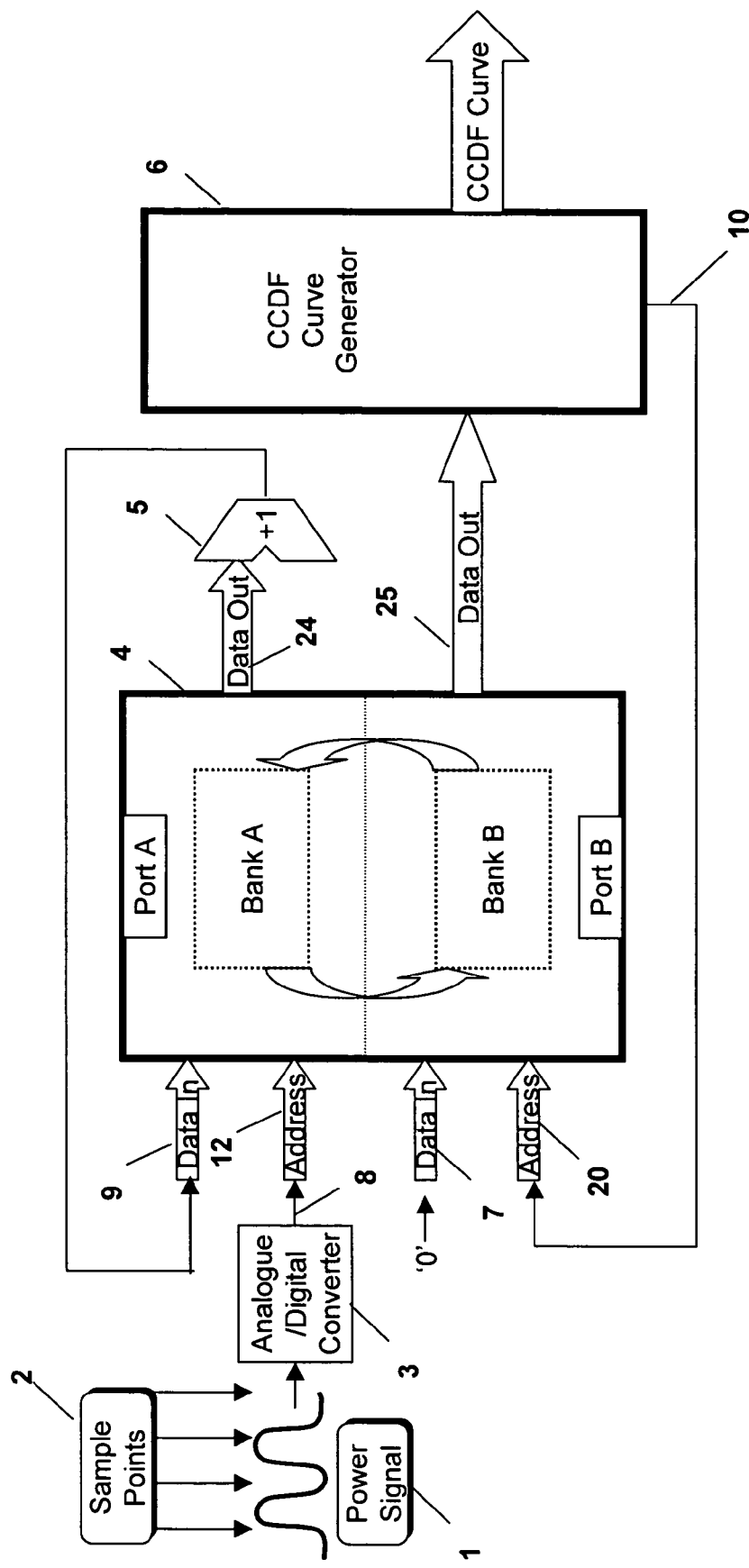
FIG. 1 shows a schematic block diagram of a basic circuit according to a first embodiment of the present invention.

As shown in FIG. 1, the basic circuit is used to digitise the input RF signal 1 by sampling it at sample points 2 using an Analogue to Digital Converter (ADC) 3. The ADC 3 has an output 8, provides a digital word of which the top n bits are used as an address presented at an address input 19 of Port A of dual port memory 4. Each sample causes the count stored in the memory at that address to be read out from the memory 4 and presented at a data output 24 of Port A to an adder 5. The adder 5 increments the count by one and provides the incremented count back to a data input 9 of Port A of the memory 4 to be written back into the memory at the same address. The count data thus provides a frequency value of the frequency of occurrence of particular parameter values of the input signal. If the parameter is power, the memory 4 provides, effectively, a continuously updated histogram of the power values for the RF input signal. These can then be read by a CCDF curve generator 6 to generate the CCDF curve quickly and efficiently in a known manner. In order to remove the overhead for the CCDF curve generator of keeping a running accumulation of the frequencies at each read point relative to the previous read point, when the CCDF curve generator 6 reads the count values, it replaces them by zero (shown at input 7). The CCDF curve generator is therefore presented with the actual frequencies per period and not a long term accumulation from which the frequencies pertaining to the current read period have to be derived.

The dual port memory 4 is a memory that is configured to be able to accept an address and to provide the contents of that address at an output all using a single port (Port A) in a single clock cycle. The adder 5 can increment the count value and provide it to the data input 9 of Port A of the dual port memory in the same clock cycle, so that the incremented count value is ready at the data input 9 of Port A of the dual port memory to be written to the address via the same port on the next clock cycle. Thus, since a particular address in the memory is read in one clock cycle and written in the next clock cycle, it takes half the frequency of the clock cycle to perform an accumulation of a sample into the memory.

In order for the count values in the memory to be read, the second port (Port B) can be used to present the address to be read at the address input 20 of Port B of the memory and to provide the contents of that address at the data output 25 in the same clock cycle. However, the memory cannot access a particular address, for example to provide the contents to the CCDF curve generator 6, by one port and write it with an updated value on the same clock cycle. Accordingly, the dual port memory is effectively divided into two banks 4A and 4B with the one bank being used for the accumulation of data, i.e. reading, incrementing and writing the count values into appropriate addresses in the bank in the memory, all through one port of the memory, while the second bank is being read to the CCDF curve generator 6 via the second port of the memory, the address to be read being taken from an output 10 of the CCDF curve generator 6 and being presented to the address input 20 of Port B of memory 4. After a predefined time period, the banks are switched, so that the bank that has been read to the CCDF curve generator 6, and set to zero, is now being written to, and the bank that was being written to in the previous time period is now read out to the CCDF curve generator 6. Switching of the banks can be done using one address bit to designate which bank is to be read and written into.

For a memory having a size of 512×36, each bank would have a size of 256×36. This means that it could accept a maximum of $2^{36}$ samples before it overflowed. For a typical memory clock speed of 100 MHz, the sample accumulation frequency would be 50 MHZ (as explained above), so that each bank could be written to for a maximum period of 23 minutes if the full 36 bits are used for accumulation and about 85 seconds if 32 bits of the word are used.

The above embodiment allows continuous sampling of the input signal at a rate of 50 MHz (for a memory clock frequency of 100 MHz); however it would be desirable to speed up the continuous sample capture rate to 100 MHz (i.e. the memory clock speed). This can be done provided two problems are solved. The first is that, for a dual port memory, one port can be used for writing and one for reading on each clock cycle. This would allow the capture and updating to take place at the memory clock speed, except if the reading and writing are to the same address. In this case, the addressed data read from one port would not match the data being written into the same address from the other port simultaneously. Accessing the same location from two ports, in general produces indeterminate results. The second problem is that if both ports are used for the updating of the data, there is no port available for reading the data out to the CCDF curve generator 6.

Figure 2:
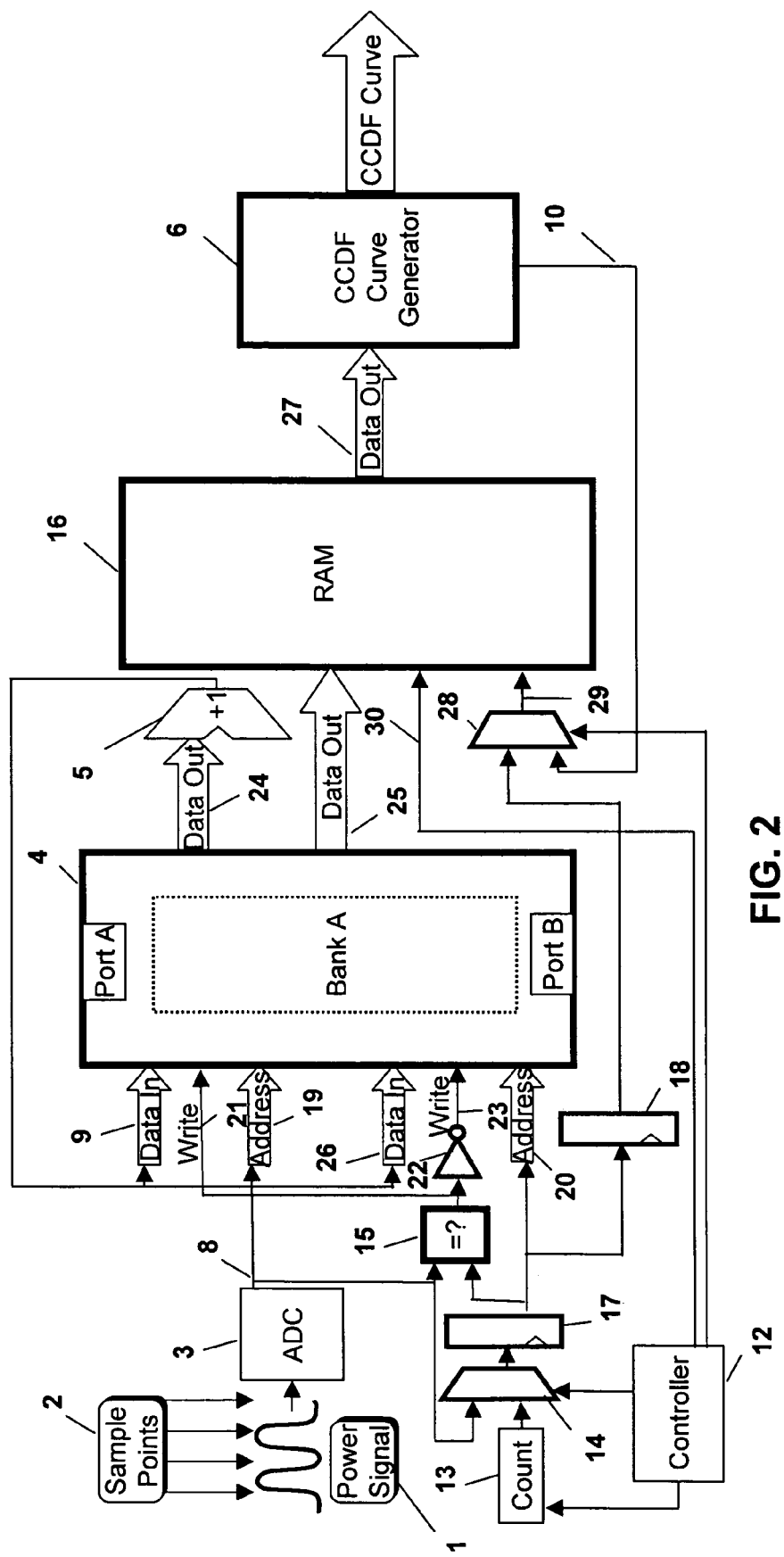
FIG. 2 shows a schematic block diagram of a circuit according to a second embodiment of the present invention.

Both problems are overcome in the second embodiment of the invention, which will now be described with reference to FIG. 2, where the same elements as those in FIG. 1 are designated using the same numerals for ease of reference. In this embodiment, in order to allow the data to be read out to the CCDF curve generator 6, the capture is halted for a short period of time periodically to allow the memory to be read out using one of the ports. The apparatus includes a controller 12 which is used to control a counter 13 for presenting a count value to a first multiplexer 14. The controller 12 sets the counter to count down from one of two possible counts so as to have, effectively, two different time periods. During a first, longer, time period, the apparatus is used in "data capture" mode to capture the required data to the memory 4 and in the second, shorter, time period, the apparatus is used in "read" mode to read the contents of the memory 4 out to a second memory 16.

Thus, the output 8 of the ADC 3 (comprising the address in the memory to be written to) is coupled to the address input 19 of Port A of the memory 4, as in the previous embodiment. The output 8 of the ADC 3 is also coupled to the first multiplexer 14 and to a first input of a comparator 15. The first multiplexer 14 is controlled by the controller 12 to present the address from the ADC 3 at its output if the count value from the counter 13 indicates that the apparatus is in the "data capture" mode. The output of the first multiplexer 14 is passed to a first latch 17, which delays the address by one clock cycle. The address is then presented to a second input of the comparator 15, as well as to a second latch 18 and to the address input 20 of Port B of the memory 4.

If the apparatus is in the "read" mode, then the controller 12 controls the multiplexer 14 to pass the count value from the counter 13 to its output. This count value is used as the address at the address input 20 of Port B of the memory 4 and the contents of that address in the memory is read out at data output 25 to the second memory 16. Clearly, therefore, as the counter 13 cycles through all the count values, each address is read out to the second memory 16 and when the counter 13 times out, all the addresses have been read and the counter is again initialised by the controller to count the time period for the "data capture" mode. If desired, as the addresses are read out to the second memory 16, the data can be set to zero, as described above with reference to the first embodiment.

As long as the apparatus is in the "data capture" mode, the comparator 15 receives the address from the ADC at its first input and the address from the ADC from the previous clock cycle, which has been passed via the multiplexer 14 and delayed in the latch 17, at its second input. Thus, the comparator compares the address at one clock cycle with the address from the previous clock cycle. The output of the comparator 15 is a match signal indicating if the two addresses are the same or not. If they are not the same, then the output from the comparator is passed to the Write input 21 of Port A of memory 4 to disable Port A from writing. This allows the address on that clock cycle presented directly at the address input 19 of Port A to be used to access that address in the memory and present the contents thereof at the data output 24 to the adder 5. At the same time, the output of the comparator is presented, via inverter 22, to the Write input 23 of Port B of memory 4 to enable Port B to write the data at data input 26 to the address provided at the address input 20. The data at the data input 26 is, of course, the incremented frequency count from adder 5.

Conversely, if the comparator finds that the two addresses are the same, then the output signal from the comparator is used to disable the Write input 23 of Port B of memory 4 and to enable the Write input 21 of Port A of memory 4 so the incremented frequency count from adder 5 at the data input 9 of Port A is used as the data to be written into the appropriate address and presented at the data output 24 to the adder 5. In this embodiment, the memory is capable of presenting, on the read port, the data written on the same cycle to the same location to the write port. This can only be achieved if the write and read are performed to the same port. As previously indicated, if this were attempted using both ports, the result would be indeterminate.

When the frequency count data for each power value has been read from the memory 4 during the "read" mode, into the second memory 16, the CCDF curve generator 6 can then read the frequency count data from the second memory 16, via data output 27 of the second memory 16, in the manner described above with reference to FIG. 1. In this case, the addresses to be read, taken from output 10 from the CCDF curve generator 6, are passed to one input of a second multiplexer 28, which is controlled by the controller 12, the second input of the multiplexer being coupled to an output of the second latch 18. The output of the second multiplexer 28 is coupled to an address input 29 of the second memory 16. The controller 12 also provides a signal to a Write input 30 of the second memory 16. Thus, the second memory 16 is enabled to write the data during the "read" mode when the data is being read from the memory 4 into the second memory 16. During this mode, the count values from counter 13, which are being used as the addresses to read memory 4, are then passed via second latch 18 to delay them by one clock cycle to the second multiplexer 28, which is controlled to pass them on to the address input of the second memory 16 so that the data read from that address in the memory 4 is then written on the next clock cycle into that address in the second memory 16. During the "data capture" mode, the controller 12 disables the Write input 30 of the second memory 16 and controls the second multiplexer 28 to pass the addresses to be read from the output 10 of the CCDF curve generator 6 to the address input 29 of the second memory 16. The addresses are therefore read and provided at the data output 27 of the second memory 16 to be processed by the CCDF curve generator 6.

In this way, the circuit can be speeded up to 100 MHz capture speed provided that the circuitry is stopped for a short time in order to read data out. When stopped one port can be used to initialise and read out the memory. Also since the memory is stopped to read, there is no need for ping-pong buffers thus doubling the effective memory size. For a memory having a size 512×36, this gives one bank of 512 (i.e. 9 bits). The accumulator would overflow after $2^{36}$ samples are received. (~11.5 minutes at 100 MHz) with 32 bit words providing an absolute minimum of 42 seconds capture before an overflow is possible. Thus, the circuit could stay in "data capture" mode for at least 42 seconds capturing $2^{32}$ samples, and then switch to "read" mode for 512 microseconds.

Figure 3:
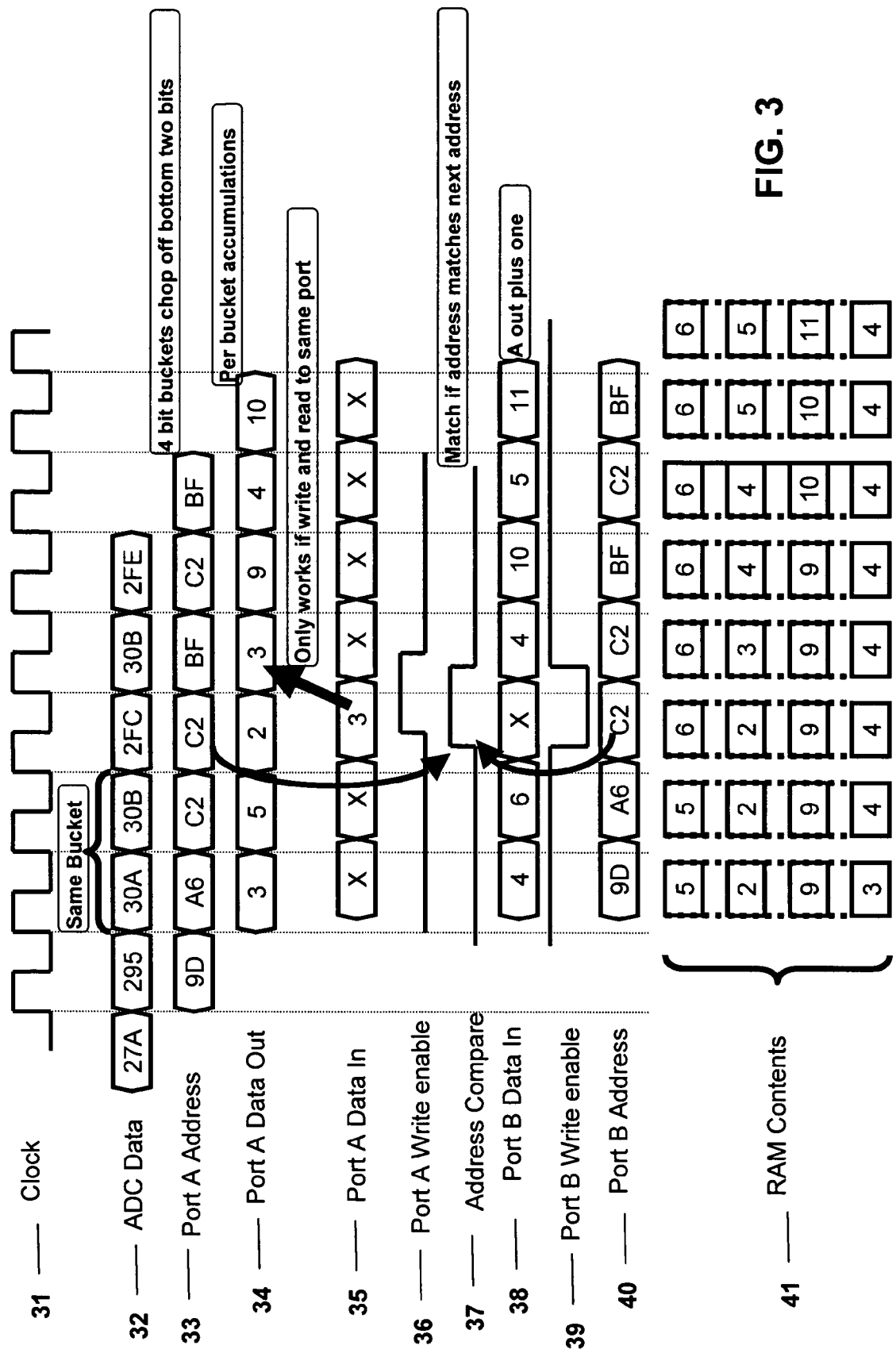
FIG. 3 shows a timing diagram for the circuit of FIG. 2.

FIG. 3 shows a timing diagram for the circuit described above with reference to FIG. 2. The first line shows the clock signal 31 running at 100 MHz. The next signal shown is the ADC Data line 32 showing a number of different power values in hexadecimal format. In the example shown, for a simplified version, the two least significant bits are ignored for 4 bit buckets (ranges) so that, as looked at from the left, the fifth and seventh power values should be put in the same bucket with the same address, as should the third, fourth and sixth power values. The address for each power value is provided on the next clock cycle on the Port A Address line 33, which, of course, shows that the third and forth addresses (from the left) are the same. The Port A Data Out line 34 indicates the frequency count for the particular address (i.e. the number of occurrences that it has previously sampled) previously stored in the memory. The updated frequency count is then provided in the Port B Data In line 38 to be written into the same address, shown on Port B Address line 40, on the next clock cycle.

In this example, the third frequency count on the Port A Data Out line is originally 2 so that the fourth frequency count, being to the same address, should be written in as 4 (since it was 2 and then two consecutive samples of this power value occurred). However, as explained above, this would only occur properly if the memory operates by reading and writing to the same port. If, as in this embodiment, the read and write are normally carried out on different ports, then the circuit needs to disable the usual write port and enable the usual read port to write so that the correct data is accumulated. As can be seen on the Address Compare signal line 37, when the second consecutive address is found to be the same (by the comparator 15), the Address Compare line 37 is enabled for one clock cycle. This causes the Port A Write enable line 36 to be enabled and the Port B Write enable line 39 (which is usually enabled) to be disabled. Furthermore, the Port B Data In signal for that clock cycle includes is a don't-care, whereas the Port A Data In signal includes the correct incremented data (count of 3) from the adder, as explained above. This means that the data from the Port A Data In line is immediately read onto the Port A Data Out line on the next clock cycle so that it can then be properly incremented and provided on to the Port B Data In line (as a count of 4) on the subsequent clock cycle. It should be noted that since the address required to perform the read and write is identical, there is no need for extra address processing circuitry on the port A address. The actual RAM Contents 41 of the four different RAM addresses is also shown for each of the clock cycles.

Figure 4:
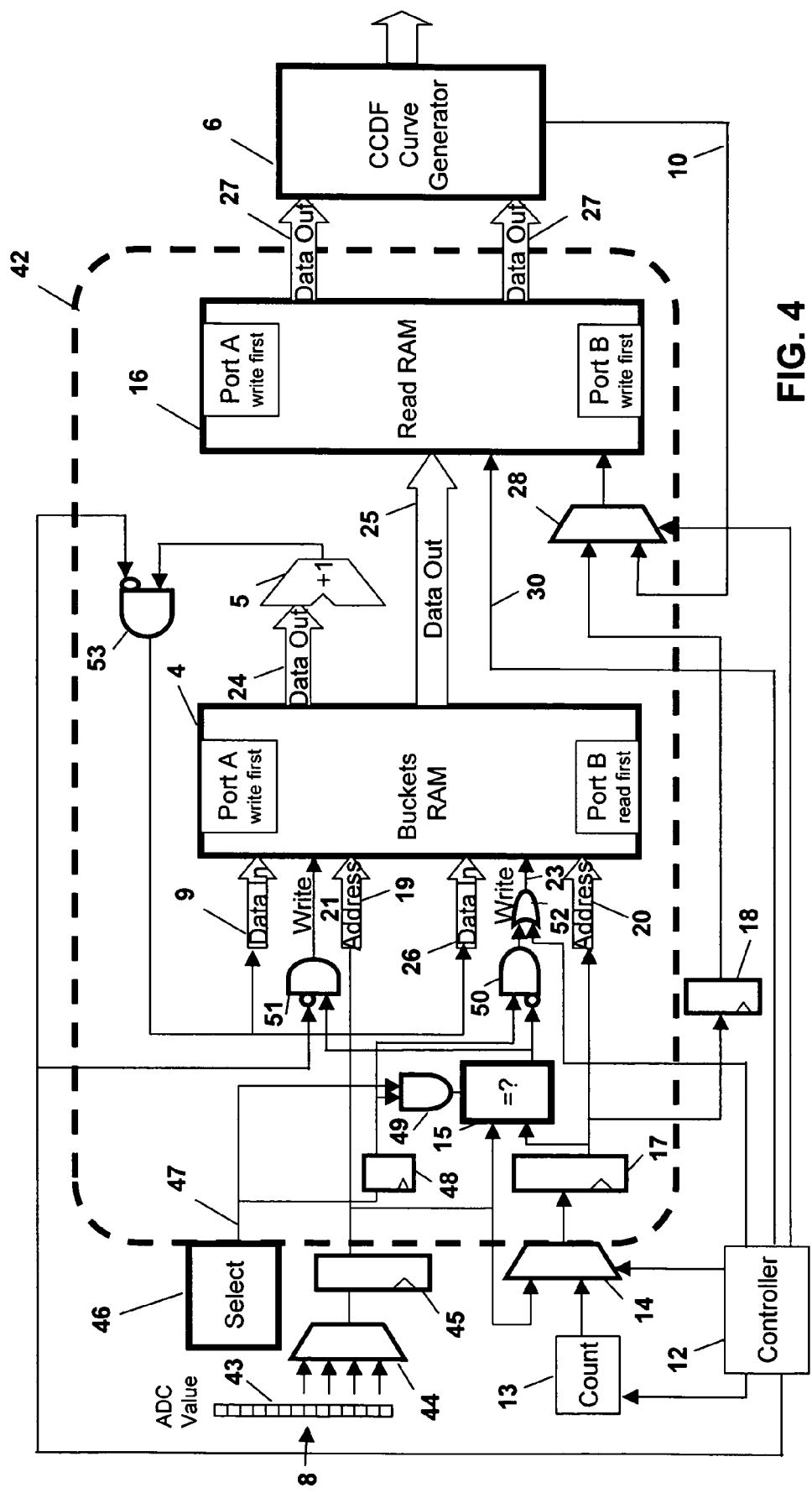
FIG. 4 shows a schematic block diagram of a circuit according to a third embodiment of the present invention.

FIG. 4 shows a third embodiment of the present invention, where, again, the same elements as in the previous embodiments are designated with the same numerals for ease of reference. In this case, as can be seen, the memory 4, the second memory 16, and some of the circuit elements including the first latch 17 and the comparator 15, form a histogram capturing block 42. In this embodiment, a data word 43 from the ADC output 8 is passed to a third multiplexer 44, which is used to pass a selected number of bits of the data word through to a third latch 45. The output of this third latch 45 provides the address passed to the address input 19 of Port A of the memory 4, as well as to the first multiplexer 14 and to the first input of comparator 15, as in the previous embodiment.

In this embodiment, the apparatus includes a plurality of similar histogram capturing blocks 42, each having the same inputs and outputs as the one shown in FIG. 4. Each histogram capturing block 42 is used to capture data in different ranges of values. It will be appreciated that a CCDF curve is usually logarithmic, so that in order to have adequate data resolution at different ranges, different ranges of the bits of the ADC word 43 should be used. For example, if only the 8 most significant bits of a 14 bit data word were to be used, then any differences in the lowest values would be lost, even though they may provide a lot of information on a logarithmic scale. Thus, in order to preserve the information, a plurality of histogram capturing blocks 42, each being used for a different value range of the power values, is provided. The number of histogram blocks can be selected according to the number of ranges of accuracy that may be required. For example, for a logarithmic scale having four decades of values, there may be five histogram capturing blocks provided: one for each decade plus one for the lowest values down to zero, as these values are necessary in order to produce an accurate figure for the average power.

Figure 5:
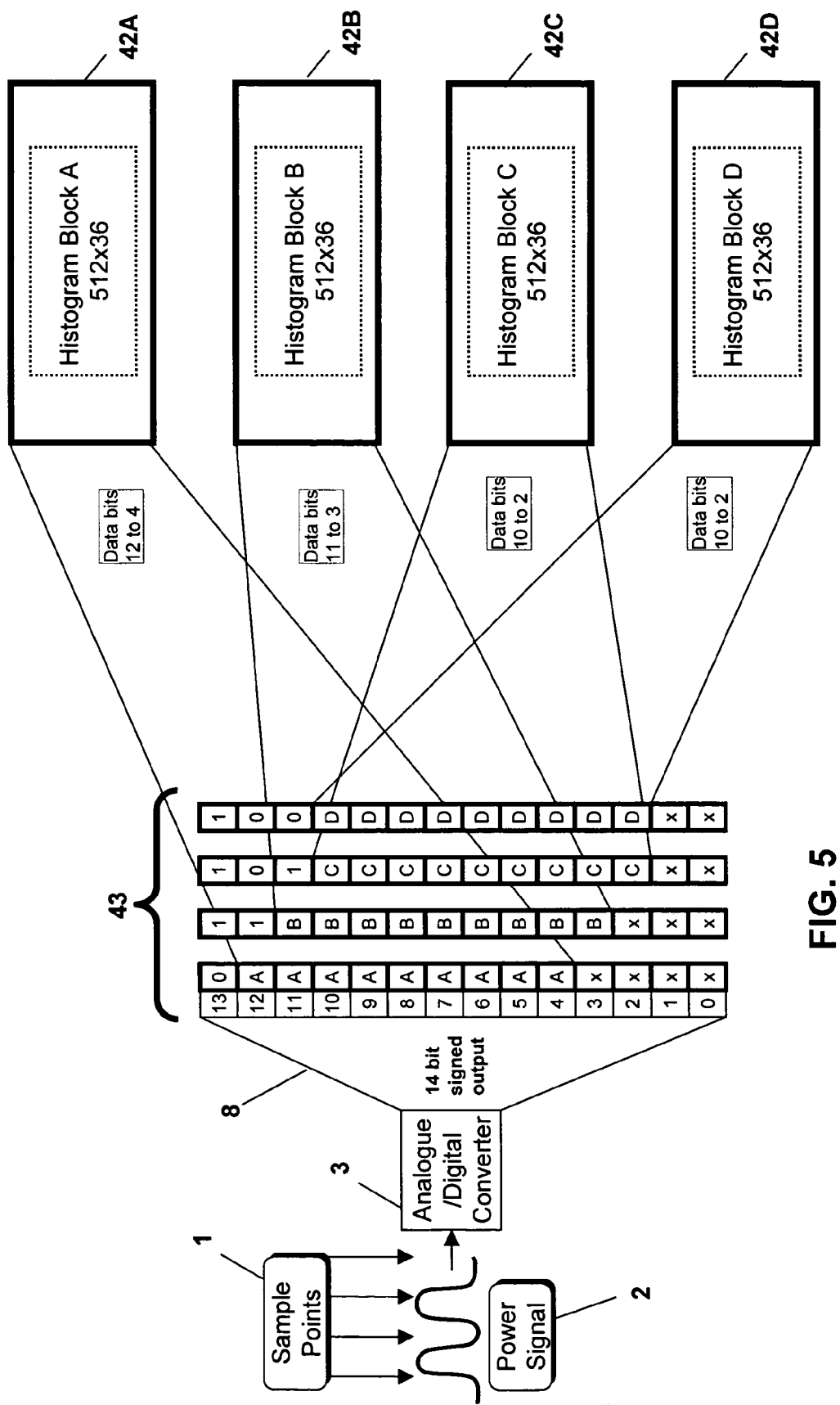
FIG. 5 shows a schematic diagram of the operation of the circuit of FIG. 4 in an expanded version.

FIG. 5 shows schematically how a 14 bit data word generated by the ADC 3 from a sample of the input signal 1, may be passed to any one of, in this case, four, 9 bit histogram capturing blocks 42A-D. As shown, bit 13 of the data word 43 indicates whether the power value is high or low. If it is a "0", as shown, it is a high-gain power value so that the next 9 bits (i.e. bits 12 to 4) are used as the address passed to high value histogram capturing block 42A. If bit 13 is a "1", then the next bit, bit 12 is looked at to determine which histogram capturing block is to be used. If bit 12 is a "1", then histogram capturing block 42B is used and the next 9 bits (bits 11 to 3) are passed as the address to histogram capturing block 42B. If bit 12 is a "0", then the next bit, bit 11 is looked at to determine which histogram capturing block is to be used. If bit 11 is a "1", then histogram capturing block 42C is used and the next 9 bits (bits 10 to 2) are passed as the address to histogram capturing block 42C. If bit 11 is a "0", then, in this case, this is the lowest range available, so that again, bits 10 to 2 are used and passed as the address to histogram capturing block 42D where the lowest values closest to zero are accumulated.

Thus, the top bits of every incoming data word are checked and depending upon their value, a set of 9 incoming bits is sent to one of the four histogram blocks. Each histogram block contains 512 scaled bins. There are more milli-watts per bin in block A compared with block D. The minimum "step size" in each histogram block (except D which is a special case) was targeted to be 0.02 dB. The lowest power range histogram has to go down to a value of zero so that a relatively accurate average value can be obtained for the purposes of drawing the CCDF curve. The number of bits covered can be extended by adding one histogram block per bit. The reason this can be done is that the CCDF curve is displayed in dB. A range of 0.02 dB at 10 mW is a much larger value than at 0.1 mW. To maintain an accuracy per bin of 0.02 dB requires less bits at lower powers. Thus a wider set of values (in this example $2^{12}$ (4096)) can be accurately used for a CCDF curve with only 2048 memory locations used. This improvement gets better when more bits are covered. A $2^{14}$ (16384) set of values can be covered with only 3072 memory locations in 6 histogram blocks.

Turning back to FIG. 4, a select controller 46 is used to select which histogram capturing block 42 is to be used for any particular power value data word 43 arriving from the ADC. The select controller 46 reads the most significant bits that are used in the data word 43, as described above, and generates an enable signal which is provided at an output 47 of the select controller 46 and is passed to the particular histogram capturing block 42 which is to capture the particular power value, and passes a disable signal to all the other histogram capturing blocks. Thus, as shown in FIG. 4, the signal from the output 47 of the select controller 46 is passed to a fourth latch 48 and to one input of a first AND gate 49. The output of the fourth latch 48 is passed to a second input of the first AND gate 49 and to one input of a second AND gate 50, whose other input is an inverted output from the comparator 15. Thus, if the select controller provides an enable signal for two consecutive clock cycles, the first AND gate 49 will generate an enable signal which is used to enable the comparator 15. The output of the comparator 15 is then passed to a third AND gate 51, and, inverted, to the second AND gate 50. The output of the second AND gate 50 is coupled to one input of an OR gate 52, whose output is coupled to the Write input of the memory 4. The other input of the OR gate 52 is coupled to receive a control signal from the controller 12.

Thus, if the select controller 46 selects this histogram capture block 42, and the output from the comparator 15 indicates that the addresses on consecutive clock cycles are the not the same, the output from the second AND gate 50 will be high (because the output from the comparator is inverted at the input to the second AND gate) and the output from the OR gate 52 will therefore be high. If, on the other hand, the output from the comparator 15 indicates that the addresses on consecutive clock cycles are the same, the output from the second AND gate 50 will be low and the output from the OR gate 52 will thus be low to disable the Write input of the memory 4. The controller output to OR gate 52 is the "read" mode signal. In "read" mode, the WRITE signal on port B is forced high so that the data value (now forced to zero by AND gate set 53) is written to all locations as the data is read out to Read RAM block 16. Furthermore, if the signal from the output 47 of the select controller 46, via the fourth latch 48, is low, indicating that this histogram capturing block 42 is not selected, then the output from second AND gate 50 will be low, and the output from OR gate 52 will also be low, thereby disabling the Write input 23, when this histogram block is not selected.

The controller 12 also generates a "read" signal which is passed to inverting inputs of the third AND gate 51 and of a fifth set of AND gates 53, whose other input is the output of the adder 5. Thus, when the output of the comparator 15 is high, indicating that the addresses are the same, and the "read" signal from the controller 12 is high, indicating that the apparatus is in the "read" mode of operation, the third AND gate 51 will have a low output (because the "read" signal is inverted) and the Write input 21 of the memory 4 will therefore be disabled. When the output of the comparator 15 is high, indicating that the addresses are the same, and the "read" signal from the controller 12 is low, indicating that the apparatus is in the "capture data" mode of operation, the third AND gate 51 will have a high output and the Write input 21 of the memory 4 will therefore be enabled. When the output from the comparator is low, indicating that the addresses are not the same, the output from the third AND gate 51 will be low, irrespective of the state of the "read" signal from the controller and the Write input 21 will always be disabled.

The output of the fifth set of AND gates 53 will only be enabled when the output of the adder 5 is high and the "read" signal is low (because the "read" signal is inverted at the input to the fifth AND gate 53), thus making sure that the output from the adder 5 is only passed to the memory 4 during the "data capture" mode of operation and set to zero during the "read" mode.

It will thus be apparent that the above described embodiment can capture tens of millions of samples per second for the whole second without gaps. Indeed a circuit based on the described architecture could run for at least 42 seconds ($2^{32}$ identical samples in a row) capturing 4.2 Giga-samples without any gaps thus capturing elusive power spikes. Comparing this with currently available solutions, a small gap in the incoming data is acceptable. By reading all the data from the memory into another identically sized memory as fast as possible, the "dead time" between measurements could be as low as 2.56 µs for a 512 word memory read at 100 MHz. A one second measurement could take place followed by a 2.56 µs gap and then another 1 second measurement could take place. If the user wants 1 billion samples ($10^9$) he would have to wait for 10 seconds to get his gap-free measurement. (compared with up to 14 hours with current equipment).

In addition, the fact that the captured frequencies exist in a memory separate from that used to perform the histogram function means that the next sample set can be captured at the same time as the CCDF curve generator is generating a curve for the last captured set of data. This further reduces dead time between sampling compared with currently available solutions.

Returning to the 100,000 sample example mentioned earlier, using a hardware approach we can capture 100,000 samples in one millisecond. Alternatively by trading off sample time and number of samples, we can provide a much more accurate measurement in a fraction of the time taken with current methods. Typically the sample time would be set to 0.1 seconds or 1 second. In that time a 0.01% measurement would be based upon 10000 samples. Even the 0.0001% measurement would be more accurate in much less than 1 second. Indeed the speed of the circuit is so fast and accurate that it is not necessary to provide control of the number of samples except in exceptional circumstances.

A CCDF output graph typically needs a range of around 15 dB with a reasonable accuracy. Since the FPGA RAMs have 512 locations, this means that only nine data bits can be processed per RAM ($2^9$=512). In order to provide sufficient accuracy, a number of blocks are provided each examining a different set of data bits. Each range is chosen to give a certain accuracy in dB. In the above described case the circuit should have six histogram blocks to provide an accuracy of better than 0.02 dB.

Since the above described circuit can examine all of an incoming waveform, it can be modified to only sample between specific points in time. This means that a pulsed Radio signal could have its CCDF measured only during the pulses.

It will be appreciated that although only three exemplary embodiments of the invention have been described in detail, various modifications and improvements can be made by a person skilled in the art without departing from the scope of the invention.

For example, the selection of appropriate ranges for each address in the memory (i.e. the amplitude of values covered within by one address) could be either automatic or programmable. Although the second memory has been shown in FIG. 4 as a dual port memory, it will be appreciated that it need not be a dual port memory and that any suitable RAM could be used.

The invention claimed is:

1. Apparatus for generating a complementary Cumulative Distribution Function (CCDF) curve for an input signal, the apparatus comprising:
   a. an Analog-to-digital Converter (ADC) having an input for receiving the input signal and an output the ADC sampling the input signal at sampling points to provide a parameter value corresponding to a desired parameter of the input signal at each sampled point at the output;
   b. a plurality of memory elements for storing frequency counts of occurrences of each received parameter value in respective, differing ranges of parameter values, each memory element having an input coupled to the output of the ADC for receiving parameter values and an output for providing a frequency count from an address in the memory corresponding to the received parameter value;
   c. a plurality of adders each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value; and
   d. a CCDF curve generating module having an input coupled to an output of the memory elements for reading the frequency counts stored in the memory elements corresponding to each parameter value and for generating a CCDF curve therefrom.

2. Apparatus according to claim 1, wherein the desired parameter is power.

3. Apparatus according to claim 1, wherein the input signal is a Radio Frequency (RF) signal, or the power envelope thereof.

4. Apparatus for generating a complementary Cumulative Distribution Function (CCDF) curve for an input signal, the apparatus comprising:
   a. an Analog-to-digital Converter (ADC) having an input for receiving the input signal and an output the ADC sampling the input signal at sampling points to provide a parameter value corresponding to a desired parameter of the input signal at each sampled point at the output;
   b. a plurality of memory elements for storing frequency counts of occurrences of each received parameter value in respective, differing ranges of parameter value; each memory element having an input coupled to the output of the ADC for receiving parameter values and an output for providing a frequency count from an address in the memory corresponding to the received parameter value;
   c. a plurality of adders each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value; and
   d. a CCDF curve generating module having an input coupled to an output of the memory elements for reading the frequency counts stored in the memory elements corresponding to each parameter value and for generating a CCDF curve therefrom wherein each memory element comprises two banks of memory of which a first bank is utilised for a predetermined period of time for storing the frequency counts of occurrences of each received parameter value and a second bank is utilised for the predetermined period for reading by the CCDF curve generating module the frequency counts of occurrences of each received parameter value stored therein in a previous predetermined period, the banks being switched at the end of the predetermined period of time so that the bank that was being read in the previous predetermined period is used for storing and vice versa.

5. Apparatus according to claim 4, wherein each memory element is a dual port memory, of which a first port is utilised as the output of the memory element coupled to the input of the respective adder on one clock cycle of the memory element and as the input of the memory element coupled to the output of the respective adder on the next clock cycle, and a second port of which is utilised as the output of the memory element coupled to the input of the CCDF curve generating module.

6. Apparatus according to claim 4, wherein updating of the frequency counts in the memory elements takes place at a frequency of half of the clock frequency of the memory elements.

7. Apparatus for generating a complementary Cumulative Distribution Function (CCDF) curve for an input signal, the apparatus comprising:
   a. an Analog-to-digital Converter (ADC) having an input for receiving the input signal and an output the ADC sampling the input signal at sampling points to provide a parameter value corresponding to a desired parameter of the input signal at each sampled point at the output;
   b. a plurality of memory elements for storing frequency counts of occurrences of each received parameter value in respective differing ranges of parameter values, each memory element having an input coupled to the output of the ADC for receiving parameter values and an output for providing a frequency count from an address in the memory corresponding to the received parameter value;
   c. a plurality of adders each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value; and
   d. a CCDF curve generating module having an input coupled to an output of the memory elements for reading the frequency counts stored in the memory elements corresponding to each parameter value and for generating a CCDF curve therefrom
wherein each memory element comprises a single bank, which is utilised for a first predetermined period of time for storing the frequency counts of occurrences of each received parameter value and is utilised for a second predetermined period of time for reading by the CCDF curve generating module the frequency counts of occurrences of each received parameter value stored therein in a previous first predetermined period.

8. Apparatus according to claim 7, wherein the CCDF curve generating module comprises a memory for storing the frequency counts of occurrences of each received parameter value read by the CCDF curve generating module during the second predetermined period of time.

9. Apparatus according to claim 7, wherein each memory element is a dual port memory, of which a first port is utilised as the output of the memory element coupled to the input of the respective adder on a first clock cycle of the memory element and a second port of which is normally utilised as the input of the memory element coupled to the output of the respective adder on a second clock cycle.

10. Apparatus according to claim 9, further comprising a comparator having a first input for receiving a received parameter value on the first clock cycle and a second input for receiving a next received parameter value on the second clock cycle and an output for providing a match signal if the received parameter value and the next received parameter value are the same, the output of the comparator being coupled to the dual port memory and the match signal being utilised to enable the first port of the dual port memory to be utilised as the input for the second clock cycle so that the frequency count incremented on the first clock cycle is provided at the first port instead of the second port and is therefore correctly provided to the input of the adder on the second clock cycle.

11. Apparatus according to claim 9, wherein updating of the frequency counts in the dual port memory takes place at the same frequency as the clock frequency of the dual port memory.

12. Apparatus for generating a complementary Cumulative Distribution Function CCDF curve for an input signal, the apparatus comprising:
   a. an Analog-to-digital Converter (ADC) having an input for receiving the input signal and an output the ADC sampling the input signal at sampling points to provide a parameter value corresponding to a desired parameter of the input signal at each sampled point at the output;
   b. a plurality of memory elements for storing frequency counts of occurrences of each received parameter value in respective, differing ranges of parameter values, each memory element having an input coupled to the output of the ADC for receiving parameter values and an output for providing a frequency count from an address in the memory corresponding to the received parameter value;
   c. a plurality of adders each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value; and
   d. a CCDF curve generating module having an input coupled to an output of the memory elements for reading the frequency counts stored in the memory elements corresponding to each parameter value and for generating a CCDF curve therefrom
wherein when a frequency count is read by the CCDF curve generating module from the memory elements, the frequency count is set to zero.

13. Apparatus for generating a complementary Cumulative Distribution Function (CCDF) curve for an input signal, the apparatus comprising:
   a. an Analog-to-digital Converter (ADC) having an input for receiving the input signal and an output the ADC sampling the input signal at sampling points to provide a parameter value corresponding to a desired parameter of the input signal at each sampled point at the output;
   b. a plurality of memory elements for storing frequency counts of occurrences of each received parameter value in respective, differing ranges of parameter values, each memory element having an input coupled to the output of the ADC for receiving parameter values and an output for providing a frequency count from an address in the memory corresponding to the receiving parameter value;
   c. a plurality of adders each associated with a respective one of the plurality of memory elements, and each having an input coupled to the output of the memory element for receiving the frequency count, for incrementing that frequency count and for providing the incremented frequency count at an output coupled to an input of the memory element for writing back into the address corresponding to the received parameter value; and
   d. a CCDF curve generating module having an input coupled to an output of the memory elements for reading the frequency counts stored in the memory elements corresponding to each parameter value and for generating a CCDF curve therefrom further comprising a multiplexer having an input coupled to the output of the ADC for receiving the parameter value and a plurality of outputs, each output being coupled to one of the plurality of memory elements, the multiplexer passing the received parameter value to one of the outputs based on the range of parameter values within which the received parameter value falls.

14. Apparatus according to claim 13, wherein the memory elements accept shorter bit length data words than the bit length of data words received from the ADC, and the multiplexer passes a reduced length of each parameter value data word received from the ADC to one of the plurality of outputs based on the most significant data bits that are present in the parameter value data word received from the ADC.

15. A method for operating an apparatus that generates a Complementary Cumulative Distribution Function (CCDF) curve for an input signal, the method comprising:
 a. sampling the input signal at sampling points to provide a parameter value corresponding to a desired parameter of the input signal at each sampled point;
 b. receiving each parameter value and storing frequency counts of occurrences of each received parameter value as they arrive, the counts being stored in respective, differing ranges of parameter values;
 c. incrementing the respective stored frequency count for each received parameter value;
 d. generating a CCDF curve from the stored frequency counts; and
 e. transmitting information specifying said CCDF curve to a device that is external to said apparatus;
wherein a first bank of a plurality of memory elements is utilised for storing for a predetermined period of time the frequency counts of occurrences of each received parameter value in respective, differing ranges of parameter values, and a second bank of the memory elements is utilised for the predetermined period for reading the frequency counts of occurrences of each received parameter value stored therein in a previous predetermined period, the banks being switched at the end of the predetermined period of time so that the bank that was being read in the previous predetermined period is used for storing and vice versa.

16. A method according to claim 15, wherein the frequency count is set to zero after the frequency count is read from the memory element.

17. A method for operating an apparatus that generates a Complementary Cumulative Distribution Function (CCDF) curve for an input signal, the method comprising:
 a. sampling the input signal at sampling points to provide a parameter value corresponding to a desired parameter of the input signal at each sampled point;
 b. receiving each parameter value and storing frequency counts of occurrences of each received parameter value as they arrive, the counts being stored in respective, differing ranges of parameter values;
 c. incrementing the respective stored frequency count for each received parameter value;
 d. generating a CCDF curve from the stored frequency counts; and
 e. transmitting information specifying said CCDF curve to a device that is external to said apparatus.
wherein a single bank of a plurality of memory elements is utilised for a first predetermined period of time for storing the frequency counts of occurrences of each received parameter value in respective, differing ranges of parameter values, and is utilised for a second predetermined period of time for reading the frequency counts of occurrences of each received parameter value stored therein in a previous first predetermined period.

18. A method for operating an apparatus that generates a Complementary Cumulative Distribution Function (CCDF) curve for an input signal, the method comprising:
 a. sampling the input signal at sampling points to provide a parameter value corresponding to a desired parameter of the input signal at each sampled point;
 b. receiving each parameter value and storing frequency counts of occurrences of each received parameter value as they arrive, the counts being stored in respective, differing ranges of parameter values;
 c. incrementing the respective stored frequency count for each received parameter value;
 d. generating a CCDF curve from the stored frequency counts; and
 e. transmitting information specifying said CCDF curve to a device that is external to said apparatus;
wherein the input signal is a Radio Frequency (RF) signal, or the power envelope thereof.

* * * * *

UNITED STATES PATENT AND TRADEMARK OFFICE
CERTIFICATE OF CORRECTION

PATENT NO. : 7,277,820 B2  Page 1 of 1
APPLICATION NO. : 11/418540
DATED : October 2, 2007
INVENTOR(S) : Johnstone et al.

It is certified that error appears in the above-identified patent and that said Letters Patent is hereby corrected as shown below:

In column 11, line 52, in Claim 1, delete "complementary" and insert -- Complementary --, therefor.

In column 12, line 20, in Claim 4, delete "complementary" and insert -- Complementary --, therefor.

In column 12, line 30, in Claim 4, delete "value;" and insert -- values; --, therefor.

In column 13, line 7, in Claim 7, delete "complementary" and insert -- Complementary --, therefor.

In column 14, line 8, in Claim 12, delete "complementary" and insert -- Complementary --, therefor.

In column 14, line 9, in Claim 12, delete "CCDF" and insert -- (CCDF) --, therefor.

In column 14, line 55, in Claim 13, delete "receiving" and insert -- received--, therefor.

In column 16, line 18, in Claim 17, delete "apparatus." and insert -- apparatus --, therefor.

Signed and Sealed this

Sixth Day of May, 2008

JON W. DUDAS
*Director of the United States Patent and Trademark Office*